(12) United States Patent
Fang et al.

(10) Patent No.: US 12,471,482 B2
(45) Date of Patent: Nov. 11, 2025

(54) DISPLAY PANEL, MANUFACTURING METHOD THEREFOR, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Jingang Fang, Beijing (CN); Luke Ding, Beijing (CN); Jun Liu, Beijing (CN); Wei Li, Beijing (CN); Jun Cheng, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 332 days.

(21) Appl. No.: 18/034,393

(22) PCT Filed: Dec. 24, 2020

(86) PCT No.: PCT/CN2020/139024
§ 371 (c)(1),
(2) Date: Apr. 28, 2023

(87) PCT Pub. No.: WO2022/133903
PCT Pub. Date: Jun. 30, 2022

(65) Prior Publication Data
US 2023/0413618 A1    Dec. 21, 2023

(51) Int. Cl.
*H10K 59/80* (2023.01)
*H10K 59/12* (2023.01)
(Continued)

(52) U.S. Cl.
CPC ... *H10K 59/80516* (2023.02); *H10K 59/1201* (2023.02); *H10K 59/126* (2023.02);
(Continued)

(58) Field of Classification Search
CPC ........ H10K 50/11; H10K 50/15; H10K 50/16; H10K 50/171; H10K 2101/30;
(Continued)

(56) References Cited

U.S. PATENT DOCUMENTS

2007/0132368 A1   6/2007   Kuwahara et al.
2018/0062109 A1   3/2018   Kim
(Continued)

FOREIGN PATENT DOCUMENTS

CN    105977267 A    9/2016
CN    106784375 A    5/2017
(Continued)

OTHER PUBLICATIONS

Office Action dated Mar. 4, 2025 for CN2020800036238 and English Translation.
(Continued)

*Primary Examiner* — Moin M Rahman
(74) *Attorney, Agent, or Firm* — Ling Wu; Stephen Yang; Ling and Yang Intellectual Property

(57) ABSTRACT

Disclosed are a display panel, a manufacturing method therefor, and a display apparatus. The display panel comprises: a base substrate (10); a padding layer (20) arranged at one side of the base substrate (10); a thin film transistor structure layer (30) arranged at one side of the base substrate (10); a planar layer (40) arranged at the side of the thin film transistor structure layer (30) away from the base substrate (10); an organic electroluminescent device (50) arranged at the side of the planar layer (40) away from the base substrate (10), the organic electroluminescent device (50) comprising
(Continued)

an anode (51), an effective light emission layer (52), and a cathode (53) in a layered arrangement; an auxiliary electrode (60) arranged on the side of the thin film transistor structure layer (30) away from the base substrate (10); and an ineffective light emission layer (521).

19 Claims, 2 Drawing Sheets

(51) Int. Cl.
  *H10K 59/126* (2023.01)
  *H10K 59/131* (2023.01)
  *H10K 59/88* (2023.01)
(52) U.S. Cl.
  CPC ..... *H10K 59/131* (2023.02); *H10K 59/80522* (2023.02); *H10K 59/88* (2023.02); *H10K 59/1315* (2023.02)
(58) Field of Classification Search
  CPC ......... H10K 2101/40; H10K 2102/351; H10K 50/852; H10K 59/35; H10K 59/12; H10K 50/156; H10K 2101/00; H10K 2102/311; H10K 59/1213; H10K 59/123; H10K 59/124; H10K 59/126; H10K 71/231; H10K 77/10–111; H10K 50/844; H10K 59/131; H10K 50/805; H10K 50/856; H10K 50/8445; H10K 50/85; H10K 59/10; H10K 59/129; H10K 2102/361; H10K 71/00; H10K 10/46–491; H10K 50/30; H10K 19/10; H10K 59/125; H10K 10/481–482; H10K 10/84; B60K 37/02; B60K 2370/1523; B60K 2370/331; B60K 2370/52; B60R 1/00; G02F 1/1368; G02F 1/136209; G02F 1/136222; G02F 1/133305; G02F 1/133388; G02F 1/13452; G02F 1/136254; G02F 2201/50; G02F 2202/28; G02F 1/1343; G02F 1/13363; H10D 86/00; H10D 64/62; H10D 62/80; H10D 86/0221; H10D 86/0231; H10D 86/423; H10D 86/60; H10D 99/00; H10D 30/67–6759; H10D 30/031–0327; H10D 86/021–0251; H10D 30/6728; H10D 86/40; B32B 2457/202; H05K 2201/10136; G09G 2380/02; G09G 2300/0426; H01L 2224/73204; H01L 21/02565; H01L 21/02631; H01L 21/0274; H01L 21/443; H01L 21/77; Y02E 10/549; C23C 14/35; G03F 5/16
  See application file for complete search history.

(56) References Cited

U.S. PATENT DOCUMENTS

| | | | |
|---|---|---|---|
| 2018/0342694 | A1 | 11/2018 | Tang |
| 2019/0004626 | A1* | 1/2019 | Ko ........................ G06F 3/0443 |
| 2022/0093894 | A1 | 3/2022 | Song et al. |
| 2023/0157133 | A1 | 5/2023 | Wang et al. |

FOREIGN PATENT DOCUMENTS

| | | | |
|---|---|---|---|
| CN | 109524443 | A | 3/2019 |
| CN | 110071225 | A | 7/2019 |
| CN | 111293148 | A | 6/2020 |
| CN | 111312923 | A | 6/2020 |
| CN | 112103326 | A | 12/2020 |
| KR | 20160026363 | A | 3/2016 |
| KR | 10-2016-0079523 | A | 7/2016 |

OTHER PUBLICATIONS

International Search Report for PCT/CN2020/139024 Mailed Sep. 27, 2021.

* cited by examiner

DISPLAY PANEL, MANUFACTURING METHOD THEREFOR, AND DISPLAY APPARATUS

CROSS-REFERENCE TO RELATED APPLICATION

The present application is a U.S. National Phase Entry of International Application No. PCT/CN2020/139024 having an international filing date of Dec. 24, 2020. The entire contents of the above-identified application are hereby incorporated by reference.

TECHNICAL FIELD

The present disclosure relates to the field of display technologies, and particularly relates to a display panel and a manufacturing method therefor, and a display apparatus.

BACKGROUND

Due to an influence of a metal wiring, an aperture ratio and Pixel Per Inch (PPI) of a bottom emission organic electroluminescent (OLED) display are greatly limited, so it is impossible to manufacture a high-resolution product. A large-size top emission oxide organic electroluminescent display is popular with consumers because its light emitting region is not affected by a metal wiring of an array substrate and a high-end product with high PPI and a high aperture ratio may be manufactured. An anode of an organic electroluminescent device of a top emission display is Al/Indium Tin Oxide (ITO) composite film, a cathode is Indium Zinc Oxide (IZO) thin film, and a thickness is about 3000 A, since a resistivity of IZO thereof is too large, a problem of uneven display brightness is easy to occur when manufacturing a large-size device due to IR drop. However, when IZO is too thick, its transmittance decreases obviously, which greatly reduces display brightness or requires more power consumption under a condition of ensuring same brightness.

Therefore, research on an organic electroluminescent display panel needs to be studied deeper.

SUMMARY

The present disclosure aims to solve one of technical problems in the related art at least to some extent. For this reason, it is an object of the present disclosure to provide a display panel which has better display brightness, a lower resistivity of a cathode in an organic electroluminescent device, or stable electrical performance.

In one aspect of the present disclosure, the present disclosure provides a display panel. According to an embodiment of the present disclosure, the display panel includes: a base substrate; a padding layer, wherein the padding layer is disposed on a side of the base substrate; a thin film transistor structure layer, wherein the thin film transistor structure layer is disposed on a side of the base substrate; a planarization layer, wherein the planarization layer is disposed on a side of the thin film transistor structure layer away from the base substrate; an organic electroluminescent device, wherein the organic electroluminescent device is disposed on a side of the planarization layer away from the base substrate, and the organic electroluminescent device includes an anode, an effective emitting layer, and a cathode that are stacked; an auxiliary electrode, wherein the auxiliary electrode is disposed on a side of the thin film transistor structure layer away from the base substrate, and an orthographic projection of the auxiliary electrode on the base substrate has an overlapping region with an orthographic projection of the padding layer on the base substrate, and is not overlapped with an orthographic projection of the effective emitting layer on the base substrate; an ineffective emitting layer, wherein the ineffective emitting layer is disposed on a surface of the auxiliary cathode away from the base substrate, and there is a gap between an outer edge of the ineffective emitting layer and the effective emitting layer. Therefore, by disposing the auxiliary electrode, a resistivity of the cathode of the organic electroluminescent device may be reduced, and the cathode with a relatively thin thickness may be set to ensure a relatively high light transmittance of the cathode; by disposing the padding layer under the auxiliary electrode to raise the auxiliary electrode, in this way, not only the effective luminescent layer in different organic electroluminescent devices may be cut off when the emitting layer is formed, but also a material of the cathode may be effectively deposited on a side surface of the auxiliary electrode when depositing to form the cathode, to form a cathode structure with a whole surface and without disconnected layers, so as to avoid a problem of poor lap of the cathode and further improve a yield of the auxiliary electrode.

According to an embodiment of the present disclosure, in a direction away from the base substrate, the auxiliary electrode includes a first sub-electrode, a second sub-electrode, and a third sub-electrode that are stacked sequentially, and a pitch between a surface of the second sub-electrode away from the base substrate and a surface of the base substrate is greater than a pitch between a surface of the planarization layer away from the base substrate and the surface of the base substrate.

According to an embodiment of the present disclosure, a pitch between a surface of the auxiliary electrode away from the base substrate and the surface of the base substrate is greater than a pitch between the surface of the planarization layer away from the base substrate and the base substrate by 0.3 micron to 0.5 micron.

According to an embodiment of the present disclosure, the planarization layer has a via penetrating through the planarization layer, the auxiliary cathode is located in the via, and a width of the gap is greater than or equal to 1.5 microns.

According to an embodiment of the present disclosure, the padding layer is disposed in a same layer as a gate in the thin film transistor structure layer.

According to an embodiment of the present disclosure, a thickness of the gate and the padding layer is 200 nm to 1000 nm.

According to an embodiment of the present disclosure, the display panel further includes a conductive shielding layer, wherein the conductive shielding layer is disposed on a side of the thin film transistor structure layer close to the base substrate, and the padding layer is disposed in a same layer as the conductive shielding layer.

According to an embodiment of the present disclosure, a thickness of the padding layer and the conductive shielding layer is 50 nm to 200 nm.

According to an embodiment of the present disclosure, the display panel further includes a conductive layer, wherein the conductive layer is disposed in a same layer as a source-drain electrode layer of the thin film transistor structure layer, and is electrically connected with the auxiliary electrode through a through hole.

In another aspect of the present disclosure, the present disclosure provides a method for manufacturing a display panel. According to an embodiment of the present disclosure, the method for manufacturing the display panel includes: providing a base substrate; forming a padding layer on a side of the base substrate; forming a thin film transistor structure layer on a side of the base substrate; forming a planarization layer on a side of the thin film transistor structure layer away from the base substrate; forming an organic electroluminescent device on a side of the padding layer away from the base substrate, wherein the organic electroluminescent device includes an anode, an effective emitting layer, and a cathode that are stacked; forming an auxiliary electrode on a side of the padding layer away from the base substrate, wherein an orthographic projection of the auxiliary electrode on the base substrate has an overlapping region with an orthographic projection of the padding layer on the base substrate and is not overlapped with an orthographic projection of the effective emitting layer on the base substrate; forming an ineffective emitting layer on a surface of the auxiliary cathode away from the base substrate, wherein there is a gap between an outer edge of the ineffective emitting layer and the effective emitting layer. Therefore, by forming the auxiliary electrode, a resistivity of the cathode of the organic electroluminescent device may be reduced, and the cathode with a relatively thin thickness may be formed to ensure a relatively high light transmittance of the cathode; by disposing the padding layer under the auxiliary electrode to raise the auxiliary electrode, in this way, not only the effective emitting layer in different organic electroluminescent devices may be cut off when the emitting layer is formed, but also a material of the cathode may be effectively deposited on a side surface of the auxiliary electrode when depositing to form the cathode, to form a cathode structure with a whole surface and without disconnected layers, so as to avoid a problem of poor lap of the cathode and further improve a yield of the auxiliary electrode.

According to an embodiment of the present disclosure, the padding layer and a gate in the thin film transistor structure layer are formed through a same process.

According to an embodiment of the present disclosure, the method for manufacturing the display panel further includes: forming a conductive shielding layer on a side of the thin film transistor structure layer close to the base substrate, wherein the padding layer and the conductive shielding layer are formed through a same process.

According to an embodiment of the present disclosure, the auxiliary electrode and the anode are formed through a same process.

According to an embodiment of the present disclosure, the method for manufacturing the display panel further includes: forming a conductive layer, wherein the conductive layer is formed through a same process as a source-drain electrode layer of the thin film transistor structure layer, and is electrically connected with the auxiliary electrode through a through hole.

In yet another aspect of the present disclosure, the present disclosure provides a display apparatus. According to an embodiment of the present disclosure, the display apparatus includes the aforementioned display panel. Therefore, the display apparatus has good electrical stability and better display brightness. It may be understood by those skilled in the art that the display apparatus has all features and advantages of the display panel described above, which will not be repeated herein.

BRIEF DESCRIPTION OF DRAWINGS

The above mentioned and/or additional aspects and advantages of the present disclosure will become apparent and easy to understand from following description of embodiments in conjunction with accompanying drawings.

DETAILED DESCRIPTION

Figure 1:
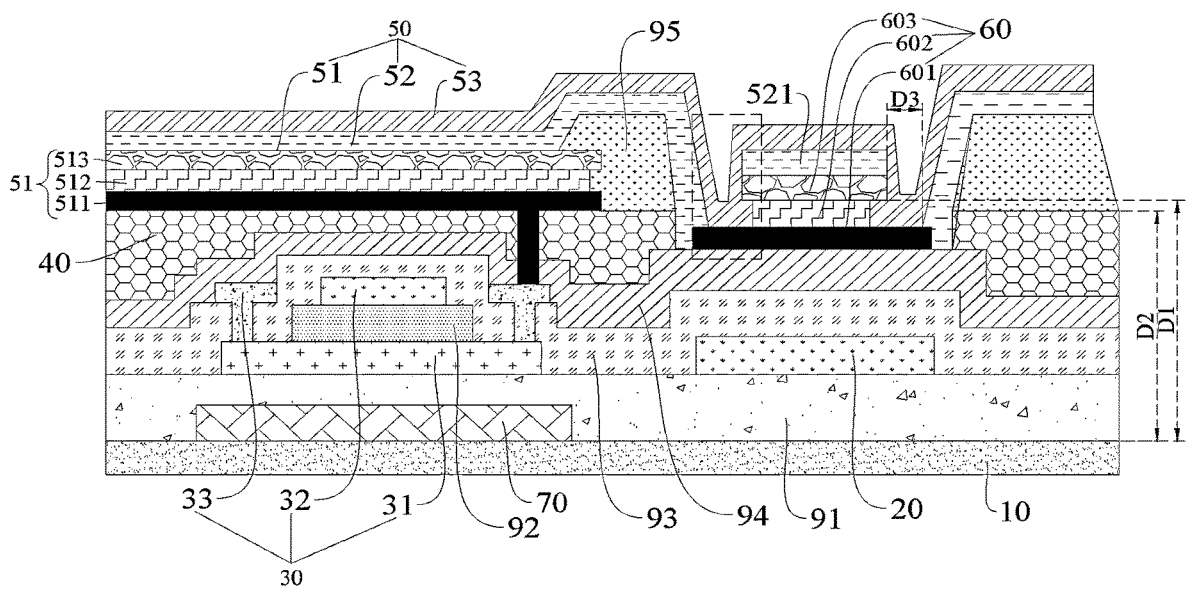
FIG. 1 is a schematic diagram of a structure of a display panel according to an embodiment of the present disclosure.

The embodiments of the present disclosure are described in detail below. The embodiments described below are exemplary and are only used for explaining the present disclosure, but should not be construed as limitations on the present disclosure. An embodiment in which a specific technology or condition is not indicated shall be carried out according to a technology or condition described in literatures in this field or according to a product specification.

In one aspect of the present disclosure, the present disclosure provides a display panel. According to an embodiment of the present disclosure, the display panel includes a base substrate 10; a padding layer 20, wherein the padding layer 20 is disposed on one side of the base substrate 10; a thin film transistor structure layer 30, wherein the thin film transistor structure layer 30 is disposed on one side of the base substrate 10; a planarization layer 40, wherein the planarization layer 40 is disposed on a side of the thin film transistor structure layer away from the base substrate 10; an organic electroluminescent device 50, wherein the organic electroluminescent device 50 is disposed on a side of the planarization layer 40 away from the base substrate 10, the organic electroluminescent device 50 includes an anode 51, an effective emitting layer 52, and a cathode 53 that are stacked; an auxiliary electrode 60, wherein the auxiliary electrode 60 is disposed on a side of the thin film transistor structure layer 10 away from the base substrate 10, an orthographic projection of the auxiliary electrode 60 on the base substrate 10 has an overlapping region with an orthographic projection of the padding layer 20 on the base substrate 10, and is not overlapped with an orthographic projection of the effective emitting layer 52 on the base substrate 10; an ineffective emitting layer 521, wherein the ineffective emitting layer 521 is disposed on a surface of the auxiliary cathode 60 away from the base substrate, there is a gap between an outer edge of the ineffective emitting layer 521 and the effective emitting layer 52, and a pitch of this gap is D3. Therefore, by disposing the auxiliary electrode, a resistivity of the cathode of the organic electroluminescent device may be reduced, and the cathode with a relatively thin thickness is disposing to ensure a relatively high light transmittance of the cathode; by disposing the padding layer below the auxiliary electrode, the auxiliary electrode is raised so that there is a certain gap between the outer edge of the ineffective emitting layer 521 and the effective emitting layer 52, in this way, not only an effective emitting layer in different organic light emitting devices may be cut off when an emitting layer is formed (the effective emitting layer in different organic light emitting devices is cut off because of a disconnection of the effective emitting layer and an ineffective emitting layer), but also a material of the cathode may be effectively deposited on a side surface of the auxiliary electrode when depositing to form the cathode, to form a cathode structure with a whole surface and without disconnected layers, so as to avoid a problem of poor lap of the cathode and further improve a yield of the auxiliary electrode.

Among them, the thin film transistor structure layer 30 includes an active layer 31, a gate 32, a source-drain electrode layer 33, and another structure. The display panel further includes a buffer layer 91, wherein the buffer layer 91 is disposed on a side of the base substrate close to the thin film transistor structure layer 30 and the active layer 31 is disposed on a surface of the buffer layer; a gate insulation layer 92, wherein the gate insulation layer 92 is disposed on a surface of the active layer 31 away from the base substrate and the gate 32 is disposed on a surface of the gate insulation layer 92; an interlayer dielectric layer 93, wherein the interlayer dielectric layer 93 is disposed on a surface of the buffer layer 91 to cover the gate 32 and the source-drain electrode layer 33 is disposed on a surface of the interlayer dielectric layer 93; a passivation layer 94, wherein the passivation layer 94 is disposed on a surface of the interlayer dielectric layer 93 away from the base substrate and covers the source-drain electrode layer 33, and the planarization layer 40 is disposed on a surface of the passivation layer 94; a pixel definition layer 95, wherein the pixel definition layer 95 is disposed on a surface of the planarization layer 40 and covers a portion of an edge region of the anode 51, wherein the anode 51 is electrically connected with the source-drain electrode layer 33 through a through hole, so as to drive the organic electroluminescent device to emit light.

Among them, a material of the active layer includes, but is not limited to, polycrystalline silicon, Indium Gallium Zinc Oxide (IGZO), Zinc Oxynitride (ZnON), Indium Tin Zinc Oxide (ITZO), and another material; a material of the gate includes, but is not limited to, a metal material, such as aluminum, molybdenum, chromium, copper, and titanium; a material of the source-drain electrode layer includes, but is not limited to, a metal material, such as aluminum, molybdenum, chromium, copper, and titanium; materials of the buffer layer, the gate insulation layer, the interlayer dielectric layer, the passivation layer, and another structure include, but are not limited to, materials, such as silicon dioxide, silicon nitride, or silicon oxynitride; the anode in the organic electroluminescent device is of a three-layer stacked structure of ITO/Ag/ITO or ITO/Al/ITO, and the cathode is made of a conductive material, such as magnesium, silver, aluminum, or IZO.

Figure 4:
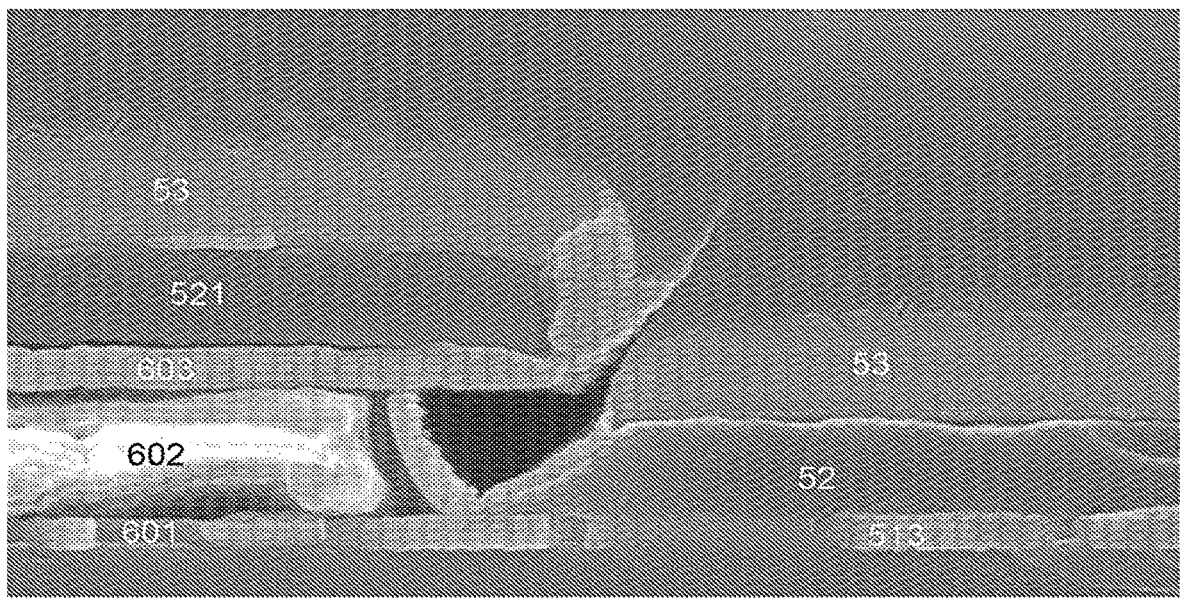
FIG. 4 is a scanning electron microscope view of a partial structure in FIG. 1.

According to an embodiment of the present disclosure, referring to FIG. 1, in a direction away from the base substrate, the auxiliary electrode 60 includes a first sub-electrode 601, a second sub-electrode 602, and a third sub-electrode 603 that are stacked sequentially (as shown in FIG. 1, the first sub-electrode 601, the second sub-electrode 602, and the third sub-electrode 603 may be disposed in an "I" shape), and a pitch D1 between a surface of the second sub-electrode 602 away from the base substrate 10 and a surface of the base substrate 10 is greater than a pitch D2 between a surface of the planarization layer 40 away from the base substrate 10 and the surface of the base substrate 10. Thus, a depth of a groove between the pixel definition layer and the auxiliary electrode 60 may effectively cut off the effective emitting layer 52 between different organic electroluminescent devices (i.e., the effective emitting layer 52 is separated from the ineffective emitting layer 521 on a surface of the auxiliary electrode 60 adjacent to the effective emitting layer 52, thereby achieving separation of the effective emitting layers in different organic electroluminescent devices), thereby facilitating independent control of a light emitting condition of an organic electroluminescent device. In a specific embodiment of the present disclosure, referring to FIG. 4, FIG. 4 is a scanning electron microscope view of a structure at a dashed line frame in FIG. 1, it may be seen from the scanning electron microscope view of FIG. 4 that the effective emitting layer 52 and the ineffective emitting layer 521 on a surface of the auxiliary cathode are separated by a gap between the effective emitting layer 52 and the ineffective emitting layer 521 on the surface of the auxiliary cathode.

According to an embodiment of the present disclosure, the anode 51 and the auxiliary electrode 60 may be obtained through a same manufacturing process act, wherein the anode also includes a first sub-anode 511, a second sub-anode 512, and a third sub-anode 513 that are stacked sequentially, wherein the first sub-anode 511 and the first electrode 601 are obtained through a same manufacturing process act, materials of the first sub-anode 511 and the first electrode 601 include, but are not limited to, a transparent conductive material such as ITO and IZO; the second sub-anode 512 and the second electrode 602 are obtained through a same manufacturing process act, materials of the second sub-anode 512 and the second electrode 602 include, but are not limited to, silver or aluminum, as a reflective electrode; the third sub-anode 513 and the third electrode 603 are obtained through a same manufacturing process act, materials of the third sub-anode 513 and the third electrode 603 include, but are not limited to, a transparent conductive material such as ITO and IZO.

According to an embodiment of the present disclosure, a pitch D1 between a surface of the auxiliary electrode 60 away from the base substrate 10 and a surface of the base substrate 10 is greater than a pitch D2 between a surface of the planarization layer 40 away from the base substrate 10 and the base substrate 10 by 0.3 micron to 0.5 micron (e.g., 0.3 micron, 0.32 micron, 0.35 micron, 0.38 micron, 0.4 micron, 0.42 micron, 0.45 micron, 0.48 micron, or 0.5 micron). Thus, a depth of a groove between the pixel definition layer and the auxiliary electrode may effectively cut off the effective emitting layer 52 between different organic electroluminescent devices, and the depth of the groove will not be too large, so as to avoid an undesirable phenomenon such as fracture and poor lap of the cathode 53.

According to an embodiment of the present disclosure, referring to FIG. 1, the planarization layer has a via penetrating through the planarization layer, the auxiliary cathode 60 is located in the via, and a width D3 of the gap is greater than or equal to 1.5 microns (e.g., 1.5 microns, 1.8 microns, 2.0 microns, 2.3 microns, 2.5 microns, 2.8 microns, 3.0 microns, 3.3 microns, 3.5 microns, 3.8 microns, or 4.0 microns). Thus, the pitch with this width further facilitates separation of the effective emitting layers 52 of different organic electroluminescent devices.

Further, a specific depth of a via 41 of the planarization layer 40 may be flexibly selected according to actual conditions, such as a specific thickness of the planarization layer and a depth of a groove. In some embodiments, the via 41 penetrates through the planarization layer i.e., the auxiliary electrode 60 is disposed on a surface of the passivation layer 94.

Further, a specific setting position of the padding layer 20 is selected according to an actual situation, as long as the auxiliary electrode 60 may be effectively raised and the effective emitting layer may be effectively cut off. The specific setting position of the padding layer is described below according to some specific embodiments of the present disclosure.

In some embodiments, referring to FIG. 1, the padding layer 20 is disposed in a same layer as the gate 32 in the thin film transistor structure layer, i.e., the padding layer 20 and the gate 32 in the thin film transistor structure layer are manufactured and obtained through a same process act. Among them, a thickness of the gate and the padding layer is 200 nm to 1000 nm, such as 200 nm, 300 nm, 400 nm, 500 nm, 600 nm, 700 nm, 800 nm, 900 nm, and 1000 nm. Thus, it is possible to make a pitch D1 between a surface of the auxiliary electrode 60 away from the base substrate 10 and a surface of the base substrate 10 larger than a pitch D2 between a surface of the planarization layer 40 away from the base substrate 10 and the surface of the base substrate 10, while ensuring good use performance of the gate.

Figure 2:
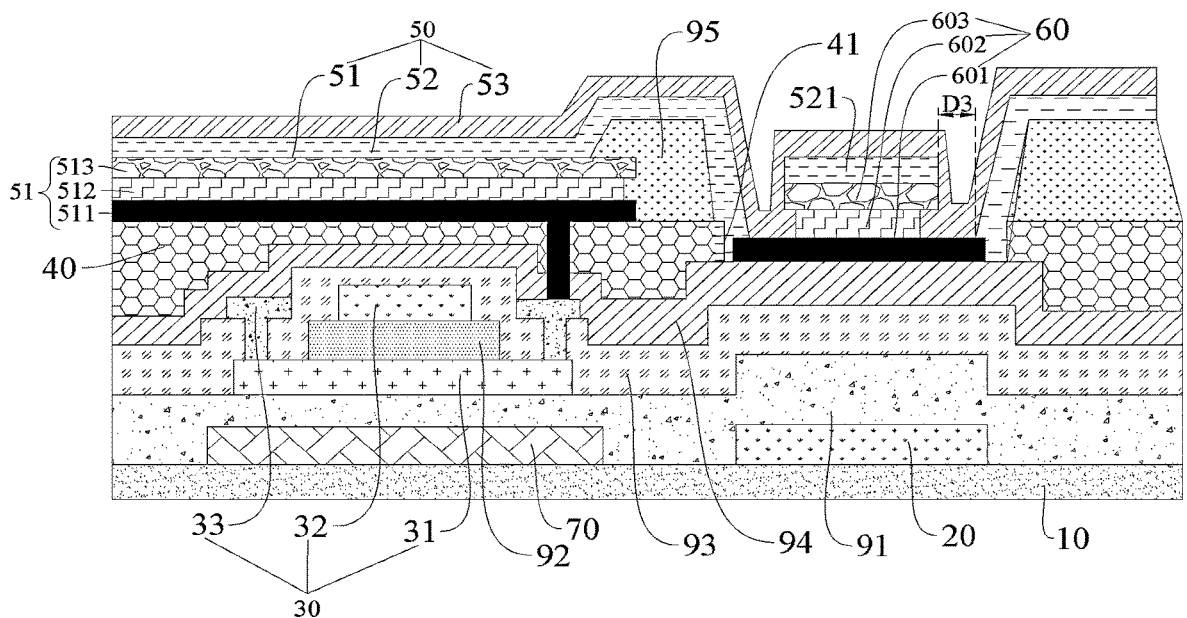
FIG. 2 is a schematic diagram of a structure of a display panel according to another embodiment of the present disclosure.

In some other embodiments, referring to FIG. 1 and FIG. 2, the display panel further includes a conductive shielding layer 70 disposed on a side of the thin film transistor structure layer 30 close to the base substrate 10 (an orthographic projection of the conductive shielding layer 70 on the base substrate covers an orthographic projection of the active layer 31 on the base substrate), and the padding layer 20 is disposed in a same layer as the conductive shielding layer 70, i.e., the padding layer 20 and the conductive shielding layer 70 are manufactured and obtained through a same process act. Among them, a thickness of the padding layer 20 and the conductive shielding layer 70 is 50 nm to 200 nm, such as 50 nm, 80 nm, 100 nm, 120 nm, 150 nm, 180 nm, and 200 nm. Thus, it is possible to make a pitch D1 between a surface of the auxiliary electrode 60 away from the base substrate 10 and a surface of the base substrate 10 larger than a pitch D2 between a surface of the planarization layer 40 away from the base substrate 10 and the surface of the base substrate 10, while ensuring good use performance of the conductive shielding layer.

Among them, a material of the conductive shielding layer 70 includes, but is not limited to, a metal material, such as aluminum, molybdenum, chromium, or titanium. Therefore, the conductive shielding layer may effectively protect the active layer.

Figure 3:
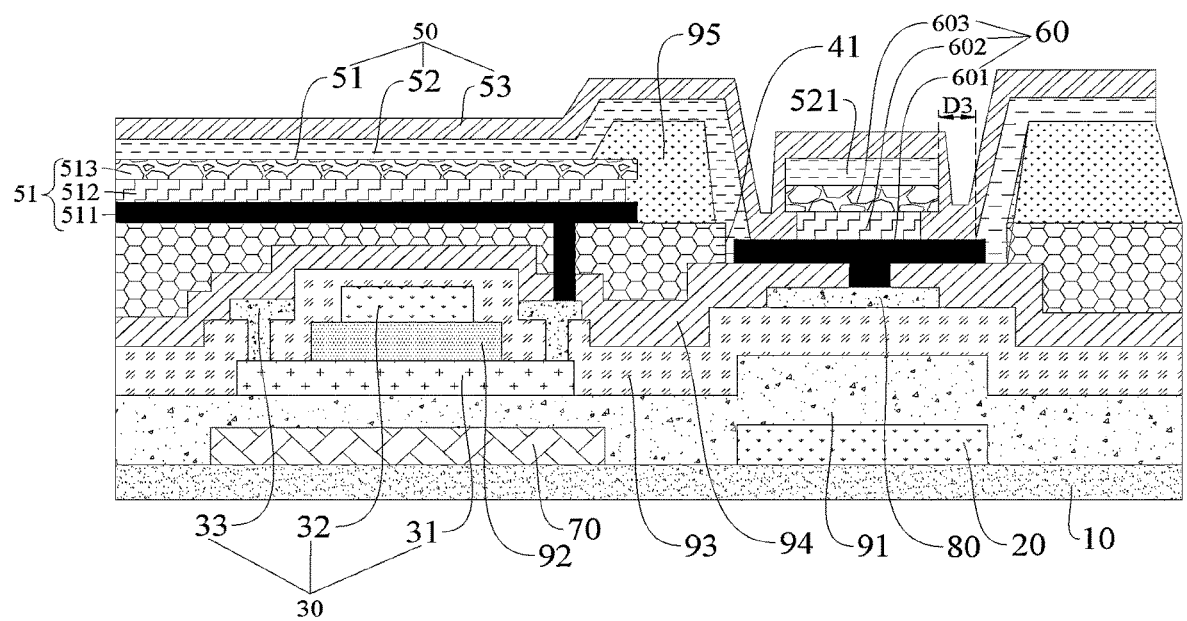
FIG. 3 is a schematic diagram of a structure of a display panel according to yet another embodiment of the present disclosure.

According to an embodiment of the present disclosure, referring to FIG. 3, the display panel further includes a conductive layer 80, the conductive layer 80 is disposed in a same layer as the source-drain electrode layer 33 of the thin film transistor structure layer 30 and is electrically connected with the auxiliary electrode 60 through a through hole. Thus, the auxiliary electrode 60 is connected in parallel with the source-drain electrode layer 33, and an effect of reducing a resistance may be achieved.

In another aspect of the present disclosure, the present disclosure provides a method of manufacturing a display panel. According to an embodiment of the present disclosure, the method of manufacturing the display panel includes following acts.

S100: providing a base substrate.

A material of the base substrate includes, but is not limited to, polymer, glass, and another material, and a thickness of the base substrate is 50 microns to 1000 microns.

S200: forming a padding layer 20 on one side of the base substrate.

S300: forming a thin film transistor structure layer 30 on one side of the base substrate.

Among them, the act of forming the thin film transistor structure layer 30 includes an act of forming an active layer 31, a gate 32, a source-drain electrode layer 33, and another structure. In the above acts, the method of manufacturing the display panel further includes: forming a buffer layer 91, wherein the buffer layer is formed on a side of the base substrate close to the thin film transistor structure layer 30, and the active layer 31 is formed on a surface of the buffer layer; forming a gate insulation layer 92, wherein the gate insulation layer 92 is formed on a surface of the active layer 31 away from the base substrate and the gate 32 is formed on a surface of the gate insulation layer 92; forming an interlayer dielectric layer 93, wherein the interlayer dielectric layer 93 is formed on a surface of the buffer layer 91 to cover the gate 32 and the source-drain electrode layer 33 is formed on a surface of the interlayer dielectric layer 93; forming a passivation layer 94, wherein the passivation layer 94 is formed on a surface of the interlayer dielectric layer 93 away from the base substrate and covers the source-drain electrode layer 33.

Further, the padding layer 20 may be manufactured and obtained through one of following methods.

In some embodiments, referring to FIG. 1, the padding layer and the gate in the thin film transistor structure layer are formed through a same process. Among them, a thickness of the gate and the padding layer is 200 nm to 1000 nm, such as 200 nm, 300 nm, 400 nm, 500 nm, 600 nm, 700 nm, 800 nm, 900 nm, and 1000 nm. Thus, it is possible to make a pitch D1 between a surface of the auxiliary electrode 60 away from the base substrate 10 and a surface of the base substrate 10 larger than a pitch D2 between a surface of the planarization layer 40 away from the base substrate 10 and the surface of the base substrate 10, while ensuring good use performance of the gate.

In some other embodiments, referring to FIG. 1 and FIG. 2, a conductive shielding layer is formed on a side of the thin film transistor structure layer 30 close to the base substrate 10 (an orthographic projection of the conductive shielding layer 70 on the base substrate covers an orthographic projection of the active layer 31 on the base substrate), and the padding layer 20 and the conductive shielding layer 70 are formed through a same process. Among them, a thickness of the padding layer 20 and the conductive shielding layer 70 is 50 nm to 200 nm, such as 50 nm, 80 nm, 100 nm, 120 nm, 150 nm, 180 nm, and 200 nm. Thus, it is possible to make a pitch D1 between a surface of the auxiliary electrode 60 away from the base substrate and a surface of the base substrate 10 larger than a pitch D2 between a surface of the planarization layer 40 away from the base substrate 10 and the surface of the base substrate 10, while ensuring good use performance of the conductive shielding layer.

S400: forming a planarization layer 40 on a side of the thin film transistor structure layer away from the base substrate 10. In some specific embodiments, the planarization layer 40 is formed on a surface of the passivation layer 94.

S500: forming an organic electroluminescent device 50 on a side of the padding layer 20 away from the base substrate 10 (i.e., an organic electroluminescent device is formed on a surface of the planarization layer 40 away from the base substrate 10), and the organic electroluminescent device 50 includes an anode 51, an effective emitting layer 52, and a cathode 53 that are stacked.

Among them, the anode 51 is electrically connected with the source-drain electrode layer 33 through a through hole, so as to drive the organic electroluminescent device to emit light.

S500: forming an auxiliary electrode 60 on a side of the padding layer away from the base substrate 10, wherein the auxiliary electrode 60 is located in a via 41, an orthographic projection of the auxiliary electrode 60 on the base substrate 10 has an overlapping region with an orthographic projection of the padding layer 20 on the base substrate 10, and is not overlapped with an orthographic projection of the effective emitting layer 52 on the base substrate 10, wherein an ineffective emitting layer 521 is formed on a surface of the auxiliary cathode 60 away from the base substrate, and there is a gap between an outer edge of the ineffective emitting layer 521 and the effective emitting layer 52. A schematic diagram of a structure of the manufactured display panel may be referred to FIG. 1 and FIG. 2.

According to an embodiment of the present disclosure, referring to FIG. 1, in a direction away from the base substrate, the auxiliary electrode 60 includes a first sub-electrode 601, a second sub-electrode 602, and a third sub-electrode 603 that are stacked sequentially (as shown in FIG. 1, the first sub-electrode 601, the second sub-electrode 602, and the third sub-electrode 603 may be disposed in an "I" shape), and a pitch D1 between a surface of the second sub-electrode 602 away from the base substrate 10 and a surface of the base substrate 10 is greater than a pitch D2 between a surface of the planarization layer 40 away from the base substrate 10 and the surface of the base substrate 10. Thus, a depth of a groove between a pixel definition layer and the auxiliary electrode 60 may effectively cut off the effective emitting layer 52 between different organic electroluminescent devices (i.e., the effective emitting layer 52 is separated from an ineffective emitting layer 521 on a surface of the auxiliary electrode 60 adjacent to the effective emitting layer 52, thereby achieving separation of the effective emitting layer in different organic electroluminescent devices), thereby facilitating independent control of a light emitting condition of an organic electroluminescent device.

According to an embodiment of the present disclosure, the auxiliary electrode 60 and the anode 51 are formed through a same process. Therefore, a process flow may be saved, a process time length may be shortened, and a manufacturing cost may be reduced. Among them, the anode also includes a first sub-anode 511, a second sub-anode 512, and a third sub-anode 513 that are stacked sequentially, wherein the first sub-anode 511 and the first electrode 601 are obtained through a same manufacturing process act, materials of the first sub-anode 511 and the first electrode 601 include, but are not limited to, a transparent conductive material such as ITO and IZO; the second sub-anode 512 and the second electrode 602 are obtained through a same manufacturing process act, materials of the second sub-anode 512 and the second electrode 602 include, but are not limited to, silver or aluminum, as a reflective electrode; the third sub-anode 513 and the third electrode 603 are obtained through a same manufacturing process act, materials of the third sub-anode 513 and the third electrode 603 include, but are not limited to, a transparent conductive material such as ITO and IZO.

According to an embodiment of the present disclosure, the aforementioned method for manufacturing the display panel may help to reduce a resistivity of a cathode of an organic electroluminescent device by forming an auxiliary electrode, and form the cathode with a relatively thin thickness to ensure a relatively high light transmittance of the cathode; the auxiliary electrode is raised by disposing a padding layer below the auxiliary electrode, so that there is a certain gap between an outer edge of the ineffective emitting layer 521 and the effective emitting layer 52, in this way, not only an effective emitting layer in different organic light emitting devices may be cut off when an emitting layer is formed (the effective emitting layer in different organic light emitting devices is cut off because of a disconnection of the effective emitting layer and an ineffective emitting layer), but also a material of the cathode may be effectively deposited on a side surface of the auxiliary electrode when depositing to form the cathode, to form a cathode structure with a whole surface and without disconnected layers, so as to avoid a problem of poor lap of the cathode and further improve a yield of the auxiliary electrode.

According to an embodiment of the present disclosure, the method for manufacturing the display panel further includes: forming a conductive layer 80, wherein the conductive layer 80 and the source-drain electrode layer 33 of the thin film transistor structure layer are formed through a same process, and the conductive layer 80 is electrically connected with the auxiliary electrode 60 through a through hole, and a schematic diagram of a structure may be referred to FIG. 3.

According to an embodiment of the present disclosure, the method for manufacturing the display panel may be used for manufacturing the aforementioned display panel, wherein requirements for a structure of the padding layer, the auxiliary cathode, the gate, the active layer, the source-drain electrode layer, the organic electroluminescent device, and the like are consistent with those described above, and will not be repeated herein.

In yet another aspect of the present disclosure, the present disclosure provides a display apparatus. According to an embodiment of the present disclosure, the display apparatus includes the aforementioned display panel. Therefore, the display apparatus has good electrical stability and better display brightness. It will be understood by those skilled in the art that the display apparatus has all features and advantages of the display panel described above and will not be repeated herein.

According to an embodiment of the present disclosure, there is no special requirement for a specific type of the aforementioned display apparatus, which may be flexibly selected by those skilled in the art according to an actual situation. In some embodiments, the specific type of the aforementioned display apparatus includes, but is not limited to, a mobile phone, a computer, an iPad, a kindle, a television, a game console, and all another display apparatus having a display function.

Those skilled in the art may understand that in addition to the aforementioned display panel, the aforementioned display apparatus also includes a necessary structure and component of a conventional display panel. Taking a mobile phone as an example, in addition to the aforementioned display panel, it also includes a structure and a component such as a touch panel, a glass cover plate, a battery back cover, a middle bezel, a battery, a motherboard, an audio module, and a camera module. In the description of the specification, description referring to terms "an embodiment", "some embodiments", "an example", "a specific example", "some examples", or the like means that a specific feature, structure, material, or characteristic described in conjunction with this embodiment or example is included in at least one embodiment or example of the present disclosure. Schematic representations of the above terms are not necessarily directed to a same embodiment or example. Moreover, the specific feature, structure, material, or characteristics described may be combined in any one or more embodiments or examples in a suitable manner. In addition, those skilled in the art may combine different embodiments or examples described in this specification and features of different embodiments or examples without contradicting each other.

Although the embodiments of the present disclosure have been shown and described above, it may be understood that the above embodiments are exemplary and cannot be interpreted as limitations on the present disclosure. A person skilled in the art may make changes, modifications, substitutions, and variations to the above embodiments within the scope of the present disclosure.

The invention claimed is:

1. A display panel, comprising:
a base substrate;
a padding layer, wherein the padding layer is disposed on a side of the base substrate;
a thin film transistor structure layer, wherein the thin film transistor structure layer is disposed on a side of the base substrate;
a planarization layer, wherein the planarization layer is disposed on a side of the thin film transistor structure layer away from the base substrate;
an organic electroluminescent device, wherein the organic electroluminescent device is disposed on a side of the planarization layer away from the base substrate, and the organic electroluminescent device comprises an anode, an effective emitting layer, and a cathode that are stacked;
an auxiliary electrode, wherein the auxiliary electrode is disposed on a side of the padding layer away from the base substrate, and an orthographic projection of the auxiliary electrode on the base substrate has an overlapping region with an orthographic projection of the padding layer on the base substrate, and is not overlapped with an orthographic projection of the effective emitting layer on the base substrate; and
an ineffective emitting layer, wherein the ineffective emitting layer is disposed on a surface of the auxiliary electrode away from the base substrate, and there is a gap between an outer edge of the ineffective emitting layer and the effective emitting layer,
wherein in a direction away from the base substrate, the auxiliary electrode comprises a first sub-electrode, a second sub-electrode, and a third sub-electrode that are stacked sequentially, and a pitch between a surface of the second sub-electrode away from the base substrate and a surface of the base substrate is greater than a pitch between a surface of the planarization layer away from the base substrate and the surface of the base substrate.

2. The display panel according to claim 1, wherein a pitch between a surface of the auxiliary electrode away from the base substrate and the surface of the base substrate is greater than a pitch between the surface of the planarization layer away from the base substrate and the base substrate by 0.3 micron to 0.5 micron.

3. The display panel according to claim 1, wherein the planarization layer has a via penetrating through the planarization layer, the auxiliary electrode is located in the via, and a width of the gap is greater than or equal to 1.5 microns.

4. The display panel according to claim 1, wherein the padding layer is disposed in a same layer as a gate in the thin film transistor structure layer.

5. The display panel according to claim 4, wherein a thickness of the gate and the padding layer is 200 nm to 1000 nm.

6. The display panel according to claim 1, further comprising: a conductive shielding layer, wherein the conductive shielding layer is disposed on a side of the thin film transistor structure layer close to the base substrate, and the padding layer is disposed in a same layer as the conductive shielding layer.

7. The display panel according to claim 6, wherein a thickness of the padding layer and the conductive shielding layer is 50 nm to 200 nm.

8. The display panel according to claim 1, further comprising: a conductive layer, wherein the conductive layer is disposed in a same layer as a source-drain electrode layer of the thin film transistor structure layer, and is electrically connected with the auxiliary electrode through a through hole.

9. A method for manufacturing a display panel, comprising:
providing a base substrate;
forming a padding layer on a side of the base substrate;
forming a thin film transistor structure layer on a side of the base substrate;
forming a planarization layer on a side of the thin film transistor structure layer away from the base substrate;
forming an organic electroluminescent device on a side of the padding layer away from the base substrate, wherein the organic electroluminescent device comprises an anode, an effective emitting layer, and a cathode that are stacked;
forming an auxiliary electrode on a side of the padding layer away from the base substrate, wherein an orthographic projection of the auxiliary electrode on the base substrate has an overlapping region with an orthographic projection of the padding layer on the base substrate and is not overlapped with an orthographic projection of the effective emitting layer on the base substrate; and
forming an ineffective emitting layer on a surface of the auxiliary electrode away from the base substrate, wherein there is a gap between an outer edge of the ineffective emitting layer and the effective emitting layer,
wherein in a direction away from the base substrate, the auxiliary electrode comprises a first sub-electrode, a second sub-electrode, and a third sub-electrode that are stacked sequentially, and a pitch between a surface of the second sub-electrode away from the base substrate and a surface of the base substrate is greater than a pitch between a surface of the planarization layer away from the base substrate and the surface of the base substrate.

10. The method according to claim 9, wherein the padding layer and a gate in the thin film transistor structure layer are formed through a same process.

11. The method according to claim 9, further comprising: forming a conductive shielding layer on a side of the thin film transistor structure layer close to the base substrate; wherein the padding layer and the conductive shielding layer are formed through a same process.

12. The method according to claim 9, wherein the auxiliary electrode and the anode are formed through a same process.

13. The method according to claim 9, further comprising: forming a conductive layer, wherein the conductive layer is formed through a same process as a source-drain electrode layer of the thin film transistor structure layer, and is electrically connected with the auxiliary electrode through a through hole.

14. A display apparatus, comprising: a display panel according to claim 1.

15. The display panel according to claim 2, wherein the padding layer is disposed in a same layer as a gate in the thin film transistor structure layer.

16. The display panel according to claim 3, wherein the padding layer is disposed in a same layer as a gate in the thin film transistor structure layer.

17. The display panel according to claim 2, further comprising: a conductive shielding layer, wherein the conductive shielding layer is disposed on a side of the thin film transistor structure layer close to the base substrate, and the padding layer is disposed in a same layer as the conductive shielding layer.

18. The display panel according to claim 3, further comprising: a conductive shielding layer, wherein the conductive shielding layer is disposed on a side of the thin film transistor structure layer close to the base substrate, and the padding layer is disposed in a same layer as the conductive shielding layer.

19. The display panel according to claim 2, further comprising: a conductive layer, wherein the conductive layer is disposed in a same layer as a source-drain electrode layer of the thin film transistor structure layer, and is electrically connected with the auxiliary electrode through a through hole.

* * * * *